United States Patent
Thayer (10) Patent No.: US 8,352,896 B2
(45) Date of Patent: Jan. 8, 2013

(54) SYSTEM AND METHOD FOR DISTRIBUTION ANALYSIS OF STACKED-DIE INTEGRATED CIRCUITS

(75) Inventor: Larry J Thayer, Fort Collins, CO (US)

(73) Assignee: Avago Technologies Enterprise IP (Singapore) Pte. Ltd., Singapore (SG)

(*) Notice: Subject to any disclaimer, the term of this patent is extended or adjusted under 35 U.S.C. 154(b) by 11 days.

(21) Appl. No.: 13/036,364

(22) Filed: Feb. 28, 2011

(65) Prior Publication Data

US 2012/0221996 A1    Aug. 30, 2012

(51) Int. Cl.
*G06F 9/455* (2006.01)

(52) U.S. Cl. .................. 716/108; 716/114; 716/126

(58) Field of Classification Search ............ 716/114, 716/126, 108
See application file for complete search history.

(56) References Cited

U.S. PATENT DOCUMENTS

| | | | |
|---|---|---|---|
| 6,037,820 A | 3/2000 | Ishizaka | |
| 6,316,981 B1 | 11/2001 | Rao et al. | |
| 6,448,168 B1 | 9/2002 | Rao et al. | |
| 6,782,519 B2 | 8/2004 | Chang et al. | |
| 6,829,754 B1 | 12/2004 | Yu et al. | |
| 6,832,361 B2 | 12/2004 | Cohn et al. | |
| 6,981,233 B2 | 12/2005 | Chang | |
| 2007/0296557 A1 | 12/2007 | Kim et al. | |
| 2008/0195986 A1 | 8/2008 | Cohen et al. | |
| 2008/0204104 A1 | 8/2008 | Peng | |
| 2009/0016033 A1* | 1/2009 | Chow et al. | 361/749 |
| 2009/0210836 A1 | 8/2009 | Phan | |
| 2009/0321893 A1* | 12/2009 | Somasekhar et al. | 257/621 |
| 2010/0217577 A1 | 8/2010 | Korobkov et al. | |
| 2012/0032294 A1* | 2/2012 | Or-Bach et al. | 257/499 |

* cited by examiner

*Primary Examiner* — Vuthe Siek
*Assistant Examiner* — Mohammed Alam (57) ABSTRACT

Systems and methods for distribution analysis of a stacked-die integrated circuit (IC) are described. The stacked-die integrated circuit includes a primary die, and clock load information for the primary die of the IC is determined. Additionally, a clock load model may be created using the clock load information for the primary die. Clock load information for a second die that is coupled to the primary die may also be determined. The clock load information for the second die may be incorporated into the clock load model to create an enhanced clock load model of the stacked-die IC, which may then be analyzed as if a single-die IC.

15 Claims, 5 Drawing Sheets

SYSTEM AND METHOD FOR DISTRIBUTION ANALYSIS OF STACKED-DIE INTEGRATED CIRCUITS

BACKGROUND

One goal when designing integrated circuit ("IC") chips is to optimize the power distribution in order to minimize voltage drops within the IC and to ensure that each component or portion of the chip (e.g., transistors, functional circuit blocks, etc.) is supplied with the optimum supply voltage. Another goal is to ensure that various components of the IC operate at the desired time in accordance with clock signal pulses.

Power supply voltages and clock signal pulses are typically supplied to an IC from an external power supply source through interconnect or bond pads on the IC. The power supply for the various components of the IC and clock signals to the desired components are routed from the interconnect or bond pads through metal conductors or other suitable wiring, collectively referred to herein as "traces." Typically, a trace carries either a power supply or a clock signal, but not both.

Traces may be formed on or in one or more layers of the IC for both horizontal and vertical power or clock signal distribution in a variety of patterns that may be regular or irregular in shape. Additionally, the traces on or in the various levels of an IC may vary in material as well as in width, diameter, and even length depending on the pattern. Accordingly, the resistive load caused by a trace in one path to a particular component of the IC (such as transistors, functional circuit blocks, etc.) may be different than the resistive load caused by a trace(s) in another distribution path.

Typical digital ICs include a large number of clocked components such as flip-flops, registers, latches, and the like that change state in response to clock signal pulses. It is desirable to synchronize state changes for groups of such IC components by tying them to the same clock signal. To this end, the IC typically employs a clock tree or branching network of conductors and buffers to synchronize all components that are clocked to a particular clock signal.

Once the IC chip has been designed, and the locations of the clocked components are known in the IC layout, a clock tree synthesis tool (CTS tool) can be used to automatically generate a distributed clock network (referred to as a clock tree) for providing clock signals to the desired components. Generating the clock tree can include laying out the conductors or traces that distribute the clock signals to the desired components, typically in a manner which tries to ensure that the clock signals reach all desired components at the same time. Differences in arrival times of each clock signal pulse among the components that are clocked together is referred to as "skew."

After the clock tree has been generated and the traces laid out, skew between components that are clocked together can be minimized or "balanced." The CTS tool can typically be used to balance the clock tree by placing buffers in selected branches of the clock tree to adjust the delay of the clock signal along that clock tree branch or signal path. Buffers typically accomplish this by increasing or decreasing the rate at which the capacitance of clock tree conductors downstream from the buffer are charged, depending on the size and composition of the buffer used in a particular clock tree branch. Thus, the CTS tool can select the number, location, size, capacitive loading, composition, etc. of the buffers used to minimize skew to an acceptable level for the IC.

However, such clock tree generating and balancing difficulties are compounded in advanced IC design, such as the various "system on a chip" designs or application specific integrated circuits ("ASICs"), including stacked-die ICs. Designers have to generate and balance the clock tree, not just for clocked components on one chip for such advanced designs, but potentially across several chips, while at the same time meeting the clocking performance requirements of the stacked-die IC. This is a task for which most conventional CTS tools are not equipped.

Accordingly, what is needed is a system and method that can easily and effectively analyze clock distribution networks for stacked-die ICs using conventional single-die analysis tools.

SUMMARY

Systems and methods for distribution analysis of a stacked-die integrated circuit (IC) are described. The method includes determining clock load information for a primary die of the IC. A clock load model in an embodiment may be created using the clock load information for the primary die. Additionally, clock load information for a second die that is electrically coupled to the primary die may be determined. The clock load information for the second die may be incorporated into the clock load model to create an enhanced clock load model of the stacked-die IC, which may then be analyzed as if it is a single-die IC.

BRIEF DESCRIPTION OF THE DRAWINGS

In the Figures, like reference numerals refer to like parts throughout the various views unless otherwise indicated. For reference numerals with designations such as or "52" and "52'" the "'" designations may differentiate two like parts or elements present in the same figure or different figures. Such designations for reference numerals may be omitted when it is intended that a reference numeral to encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "database," "module," "system," "element," and the like are intended to refer to a computer-related entity, either hardware, firmware, a combination of hardware and software, software, or software in execution. For example, an element may be, but is not limited to being, a process running on a processor, a processor, an object, an executable, a thread of execution, a program, and/or a computer. By way of illustration, both an application running on a computing device and the computing device may be an element.

Similarly, one or more elements may reside within a process and/or thread of execution, and a component may be localized on one computer and/or distributed between two or more computers. In addition, these elements may execute from various computer readable media having various data structures stored thereon. The elements may communicate by way of local and/or remote processes such as in accordance with a signal having one or more data packets (e.g., data from one component interacting with another element or component in a local system, distributed system, and/or across a network such as the Internet with other systems by way of the signal).

Figure 1:
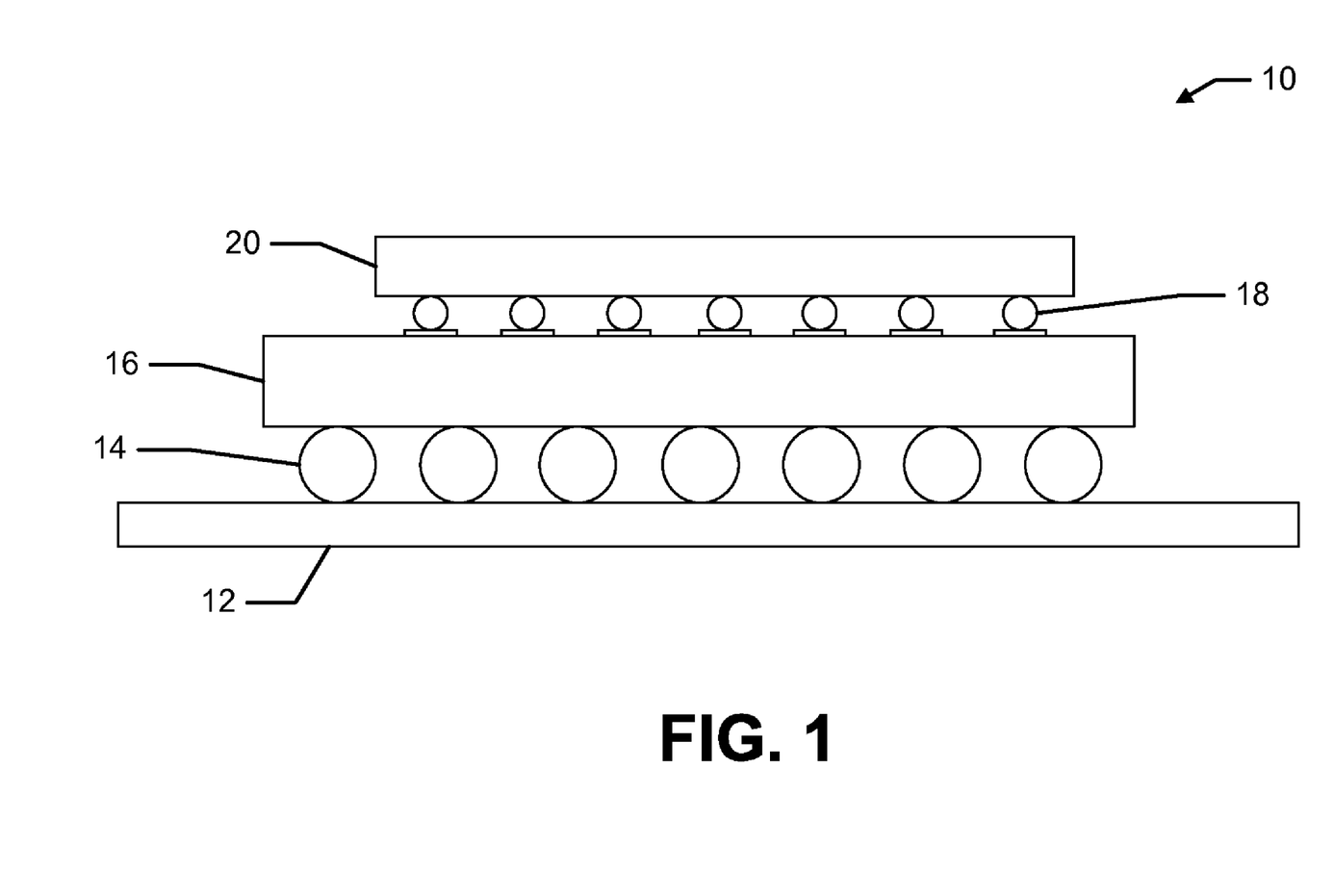
FIG. 1 illustrates a side views of an exemplary stacked-die IC for which the present invention can provide power distribution analysis.

Referring to FIG. 1, this figure illustrates a side view of an exemplary stacked-die IC for which the embodiments of the present invention can provide power distribution analysis. FIG. 1 shows an IC package 10 that includes a substrate 12 which may be formed from any suitable substrate material. According to the exemplary embodiment, one or more solder balls 14 serve to electrically connect substrate 12 to primary die 16 and provide power and/or clock signals to the primary die 16.

Primary die 16, may be formed from silicon, or any other suitable material. Additionally, primary die 16 includes one or more transistors or other components (e.g. functional circuits) that will be electrically and mechanically connected to one or more of the solder balls 14 via conductive wiring or traces located in or on the primary die 16. Such conductive wiring or traces may be made of any suitable conducive material, including for example, copper. Additionally as would be known to one of skill in the art, there are various other methods and/or structures that may be used to connect the primary die 16 to the substrate 12 and/or to provide power to the primary die 16, such as, for example, wire bonds.

The primary die 16 will contain, or will be coupled to, a clock signal generator that generates clock signal pulses. The clock signal pulses will travel to the desired components (e.g. transistors, functional circuits, flip-flops, registers, etc.) along separate conductive wiring or traces than those providing power to the components of the primary die 16. Such clock signal traces will typically be located in specified layers of the primary die 16. Additionally, as discussed above, such clock signal traces in the primary die 16 may also include one or more buffers of varying size, capacitive loading, number of stages, threshold voltage, etc., at specified locations in order to assist with minimizing skew of the clock signals sent to the desired components of primary die 16.

As illustrated in FIG. 1, the exemplary IC package 10 also includes a second die 20, which is electrically and mechanically connected to the upper surface of the primary die 16 by one or more solder bumps 18. Second die 20 may be formed from silicon, or any other suitable material. Additionally, second die 20 will include one or more transistors or other components (e.g. functional circuits) that will be electrically connected to one or more of the solder bumps 18 via conductive wiring or traces located in or on the second die 20. Such conductive wiring or traces may be made of any suitable conducive material, including for example, copper. Additionally as would be known to one of skill in the art, there are various other methods and/or structures that may be used to connect the second die 20 to the primary die 16 and/or to provide power to the second die 20, such as, for example, wire bonds.

One or more of the solder bumps 18 connecting second die 20 to primary die 16 may conduct clock signals to components of second die 20 that are desired to be clocked. The one or more solder bumps 18 conducting the clock signals to second die 20 typically do not also conduct power to the second die 20. Thus a particular solder bump 18 may conduct clock signals or electrical power to the second die 20, but not both. Second die 20 will also include conductive wiring or traces to transmit the clock signals to desired components of second die 20 (e.g. transistors, functional circuits, flip-flops, registers, etc.). These clock signal traces will be separate from the conductive wiring or traces providing power to the components of the second die 20, and such clock signal traces will typically be located in specified layers of the second die 20. Additionally, as with the clock signals traces for the primary die 16, the clock signal traces in the second die 20 may also include one or more buffers of varying sizes, capacitive loading, number of stages, threshold voltage, etc., at specified locations in order to assist with minimizing skew of the clock signals sent to the desired components of second die 20.

As would be known to one of skill in the art, primary die 16 may have more than one second die 20 connected across the upper surface of the primary die 16 in the manner described above to allow power and/or clock signals to be supplied to each second die 20, or multiple second dice 20 may be connected to the primary die 16 by different methods allowing power and/or clock signals to be supplied to each second die 20 as desired. Additionally, the second die 20 may have an additional die (not shown) connected to the upper surface of the second die 20, creating a vertical stack of dice on the upper surface of the primary die 16. These additional die (not shown) may be connected to the second die 20 in the manner described above to allow power and/or clock signals to be supplied to the additional die, or by any other appropriate method as would be known to one of skill in the art.

Depending on the IC package 10 desired, the primary die 16 and/or secondary die 20 may be processors, memory blocks (including, without limitation, DRAM, Flash ROM, EEPROM, or RAM), field-programmable gate arrays, analog components, or any like component, or any combination thereof. When designing the primary die 16 and/or secondary die 20, the voltage and clock signal needs for each (and the various parts or portions of each) will need to be taken into account to ensure proper operating voltages and timing are maintained. An exemplary method for accounting for the voltage needs in a single-die IC package is to model the various portions of the die as circuits, showing the power load for each portion of the die. Similarly, an exemplary method for accounting for the clock timing needs in a single-die IC package is to model the various portions of the die as circuits, showing the buffers and clock distribution load for each portion of the die (represented by capacitors).

Figure 2:
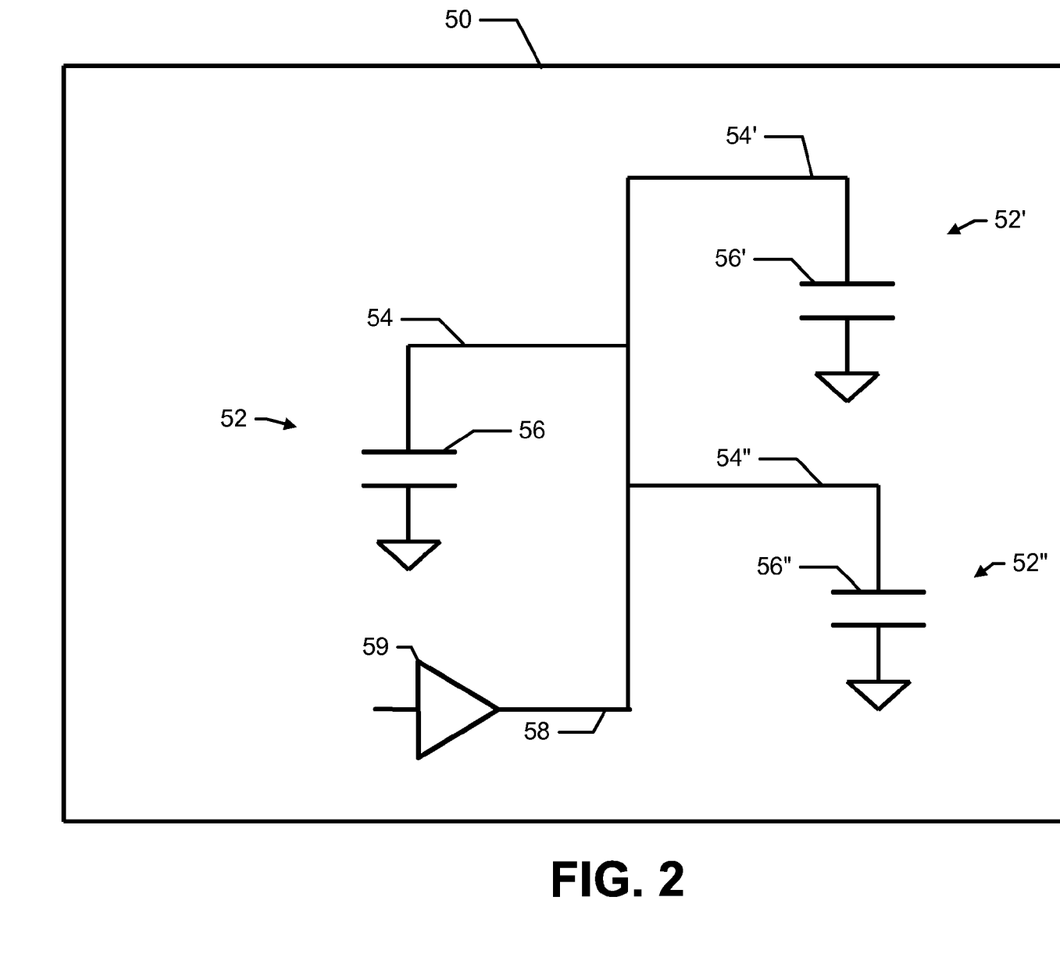
FIG. 2 is a diagram illustrating an exemplary clock load model of a portion of the stacked-die IC illustrated in FIG. 1.

Turning to FIG. 2, this figure is a diagram of an exemplary clock distribution load model 50 of the primary die 16 of the stacked-die IC illustrated in FIG. 1. As with a single-die IC package, the primary die 16 of the stacked-die IC may be directly modeled through a variety of known methods, and using a variety of known modeling applications. In the exemplary embodiment shown in FIG. 2, the clock distribution load model 50 shows the clock distribution loads 52, 52', and 52" for the various portions, transistors, functional circuits, etc., of primary die 16 that are to be clocked together.

Although three clock distribution loads 52, 52', and 52" are depicted in the exemplary embodiment shown in FIG. 2, fewer or more clock distribution loads may be present and/or may be arranged in differing configurations, depending on the type of die being modeled and/or how many components of the die are desired to be clocked together.

Additionally, the clock distribution loads 52, 52', and 52" are shown as RC loads comprising the RC network of the clock distribution interconnect, with for example, clock distribution load 52 including the resistivity in the conductor providing the supply current 54 to capacitor 56. Other ways of showing or modeling the clock distribution loads 52, 52', and 52" are also possible as would be known to one of skill in the art. Note that in the embodiment shown in FIG. 2, the value of each clock distribution load 52, 52', and 52" includes the load caused by the path that supplies power to the portion being modeled (e.g. any load from the clock signal trace).

Using this modeling system, the clock distribution load of the primary die 16 may be analyzed, and the net clock distribution load 58 of the primary die 16 may be calculated. As part of the analysis, the clock loads may be balanced, and areas where excessive skew is present may be identified so that the design may be corrected such as by the addition of one or more clock buffers 59 configured to increase or decrease the delay of a clock pulse to one or more clocked component of primary die 16. Such clock buffers 59 may vary in transistor size, capacitive loading, number of stages, threshold voltage, etc. as desired. Additionally, skew may be addressed in other ways, such as by adjusting the resistivity of the clock signal trace to a particular clocked component of primary die 16.

Note that exemplary embodiments discuss measuring and/or analyzing clock loads consisting of an RC network. As one of skill in the art would recognize, other embodiments could measure and/or analyze other properties, from which a clock load may be determined or derived without deviating from the principles and scope of the present invention.

Figure 3:
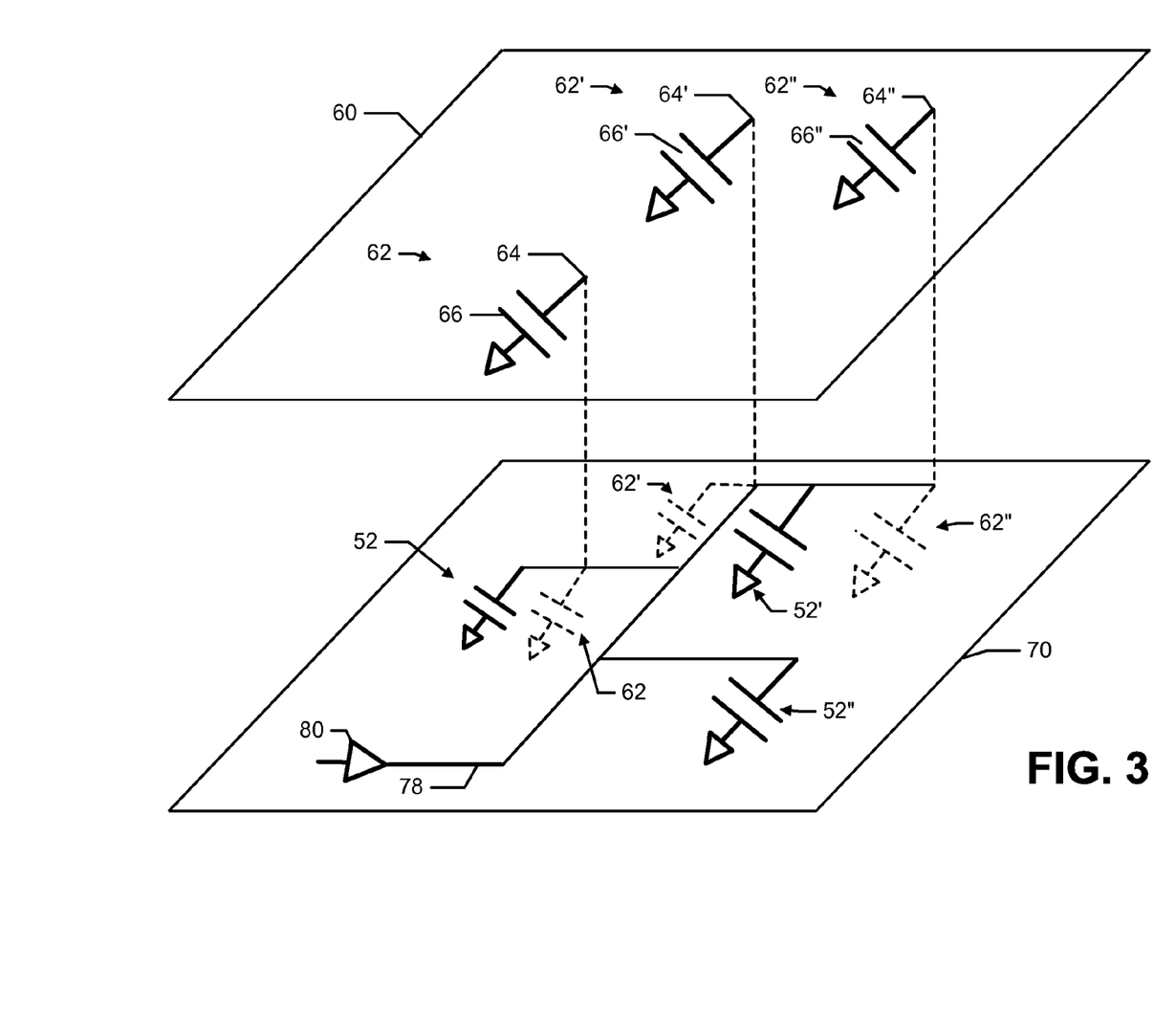
FIG. 3 is a diagram illustrating an exemplary clock load model of the stacked-die IC illustrated in FIG. 1.

Further, as illustrated in FIG. 3, additional dice, such as second die 20, may also be modeled along with the primary die 16 to analyze the clock distribution of the entire IC package 10. FIG. 3 is a diagram showing an exemplary clock distribution load model a stacked-die IC package 10, such as the one shown in FIG. 1. As shown in FIG. 3, a second clock distribution load model 60 can be made of the second die 20. In the exemplary second clock distribution load model 60 illustrated in FIG. 3, secondary clock loads 62, 62', and 62" are determined for the various components of secondary die 20 desired to be clocked together with the components of primary die 16. Although three secondary clock loads 62, 62', and 62" are depicted in the exemplary embodiment shown in FIG. 3, fewer or more clock loads may be present and/or may be arranged in differing configurations, depending on the type of die being modeled and/or how many components of the second die 20 are to be clocked together.

Additionally, the secondary clock loads 62, 62', and 62" are shown in FIG. 3 as RC loads comprising the RC network of the clock distribution interconnect, with for example, clock distribution load 62 including the resistivity in the conductor providing the supply current 64 to capacitor 66. Other ways of showing or modeling the clock distribution loads 62, 62', and 62" are also possible as would be known to one of skill in the art. Indeed, in some embodiments the secondary clock distribution loads 62, 62' and/or 62" may be estimated by the designer, such as by assigning a clock load value based on the type of component that the secondary clock distribution load 62, 62' and/or 62" represents. Note that in the embodiment shown in FIG. 3B, the value of each secondary clock distribution load 62, 62', and 62" includes the load caused by the path that supplies power to the portion being modeled (e.g. any load from the clock signal trace).

In the exemplary embodiment shown in FIG. 3, once the secondary clock distribution loads 62, 62' and 62" are determined, they are projected onto the clock distribution load model 50 for the primary die 16 (see FIG. 2), creating an enhanced clock distribution load model 70, representing the clock distribution network for both of the dice in the stacked-die IC package 10 illustrated in FIG. 2. Note that the location of the secondary clock distribution loads 62, 62', and/or 62" on the enhanced clock distribution load model 70 may be determined by the clock signal connections between the primary die 16 and second die 20.

Using the illustrative stacked-die IC package 10 shown in FIG. 1 as an example, the primary die 16 provides clock signals to the second die 20 through one or more clock signal solder bumps 18 (see FIG. 1). In that example, the secondary clock distribution load 62 may represent one or more components on the second IC 20 that receives clock signals from a single solder bump 18. Accordingly, in that example, the secondary clock load 62 would be located on the enhanced clock distribution load model 70 at a location corresponding to the location on the primary die 16 of the solder bump 18 that provides the clock signal to the secondary clock distribution load 62. Continuing that example, the value of that secondary clock distribution load 62 may represent a combined value of the clock loads from multiple components and/or functional circuits on the second die 20 to be clocked together, the combined loads from all clock signal pathways connecting those multiple components, and any load associated with the transfer of the clock signal from the primary die 16 to the secondary die 20 through the solder bump 18. This process may be repeated until all of the secondary clock distribution loads 62, 62' and 62" are accounted for on, or projected onto, the enhanced clock distribution load model 70 with their proper or estimated values, in the correct locations.

Once the enhanced clock distribution load model 70 is completed, the clock distribution network of the entire stacked-die IC package 10 may be analyzed as if it were a single-die IC. For instance, the total clock distribution power 78 may be calculated as if it were a single-die IC, while still taking into account the total clock load required by both primary die 16 and second die 20. As part of the analysis, the clock loads may be balanced, and areas where excessive skew is present may be identified so that the design may be corrected such as by the addition of one or more clock buffers 80 configured to increase or decrease the delay of a clock pulse to one or more clocked components of primary die 16 and/or second die 20. Such clock buffers 80 may vary in size, capacitive loading, number of stages, threshold voltage, etc. as desired. Additionally, skew may be addressed in other ways, such as by adjusting the resistivity of the clock signal trace to a particular clocked component of primary die 16 and/or second die 20.

The exemplary embodiments discuss measuring and/or analyzing clock loads comprising an RC network. As one of skill in the art would recognize, other embodiments could measure and/or analyze other properties, from which a clock load may be determined or derived without deviating from the principles and scope of the present invention.

Additionally, while the above embodiments discuss a primary die 16 and a second die 20, other embodiments may include a primary die 16 with multiple second dice 20 located at various locations on the primary die 16, and connected to the primary die 16 though a variety of methods that allow reception of clock signals from the primary die 16. Similarly, additional embodiments may include a primary die 16, a second die 20 attached to the primary die 16, and one or more additional dice attached to the second die 20, creating a vertical stack of dice on the primary die 16 through a variety of methods that allow reception of clock signals from the primary die 16. Such vertical stacks may be created with through silicon vias, larger solder balls, tall balls, or other means known to one of skill in the art. In such embodiments the modeling or estimation of clock loads for successive dice may take place as described above, with each die's loads being accounted for on the model of the underlying die, until the loads for all dice desired to be analyzed are accounted for and/or projected onto the enhanced clock distribution load model 70 for the multi-die IC package 10.

Figure 4:
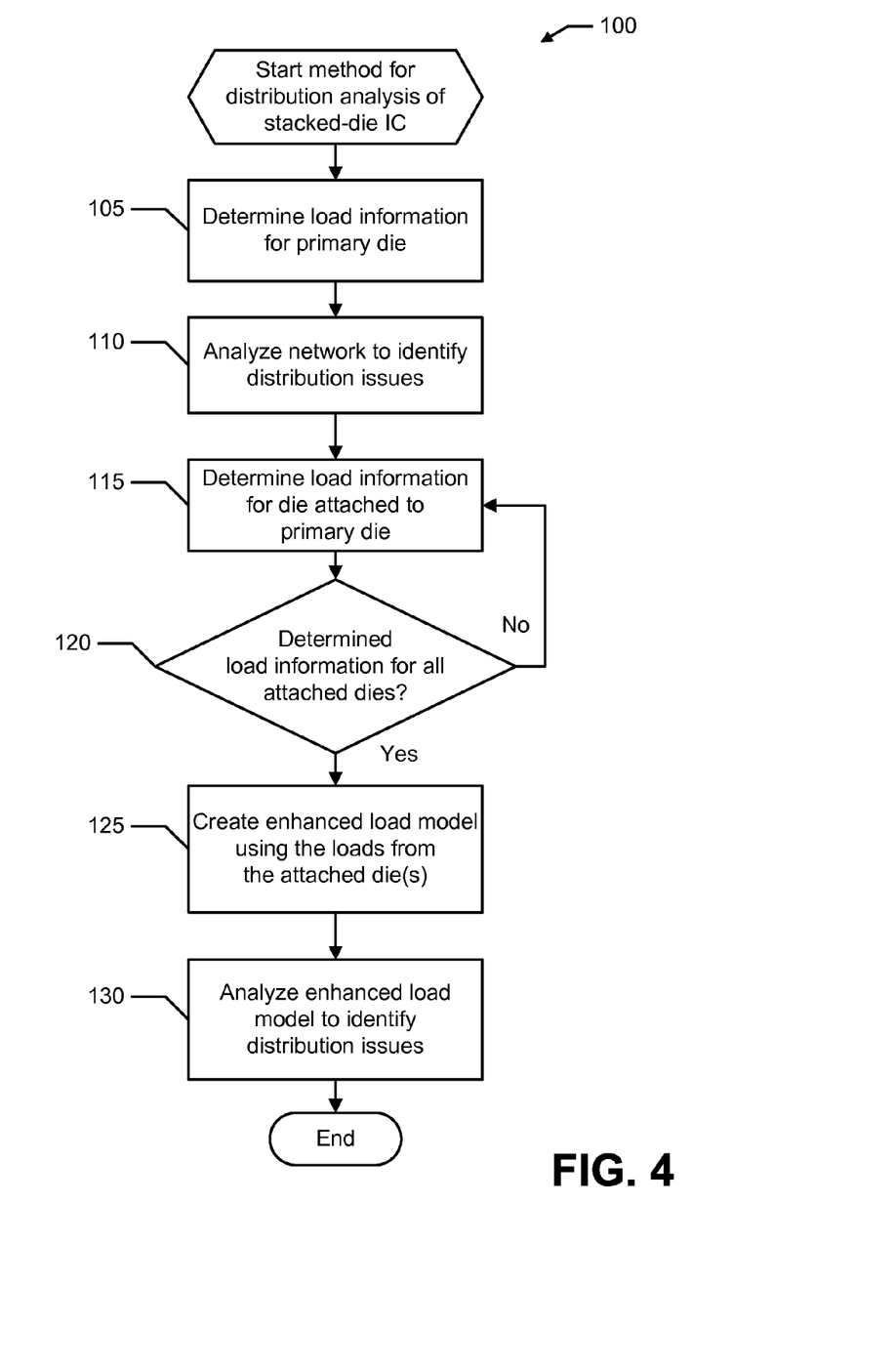
FIG. 4 illustrates an exemplary method for analyzing a distribution network of a stacked-die IC.

Referring now to FIG. 4, this figure illustrates an exemplary method 100 for analyzing the distribution of a stacked-die IC package 10, and in particular analyzing a clock distribution in this embodiment. As described relative to FIG. 1 and subsequent figures, an illustrative stacked-die IC package 10 may include a primary die 16 connected by, and providing clock signals through, one or more solder bumps 18 to a second die 20. Beginning at step 105 of FIG. 4, load information can be determined for the primary die 16, such as by creating a distribution load model 50 representing the clock loads 52, 52' and 52" of the components of the exemplary primary die 16 to be clocked together.

Once the clock load information is determined for the primary die 16, it may optionally be analyzed in accordance with step 110 to identify distribution issues, such as in this embodiment, areas, pathways, or clock tree branches where excessive skew is present. This analysis may be used to correct any design defects in the primary die 16 if desired and/or to determine the net clock 58 of the primary die.

For multi-die IC packages 10 like the exemplary IC package 10 illustrated in FIG. 1, load information for a die attached to the primary die 16, such as the second die 20 of FIG. 1, is determined at step 115. In this embodiment, the load information will be clock load information. Clock load information can be determined for the second die 20, by separately modeling the clock loads of the various components of the second die 20 that are to be clocked together. Additionally, one or more portions of the clock load information may be determined by estimation by the designer, such as by assigning a clock load value based on the type of component, that the secondary clock load 62, 62' and/or 62" represents. In some embodiments, the modeled or estimated value of secondary clock load 62, 62' and/or 62" may include the load from the particular portion of the second die 20, as well as any load incurred or caused by the path that supplies the clock signal to the component being clocked.

In some embodiments, the primary die 16 has multiple second dice 20 attached thereto, horizontally on the primary die 16 and/or vertically stacked on succeeding second dice 20. For such embodiments, a determination is made at step 120 whether load information has been determined for all desired attached dice. This determination can be made automatically by virtue of previously set parameters for the IC package 10 being analyzed, or through other methods, such as by a designer manually selecting additional dice to be part of the analysis, or a designer selecting one or more additional dice to be part of the analysis from a menu, pop-up window, or the like on a computer screen, either before or during the analysis.

If load information has not been determined for all desired attached dice, the method 100 returns to step 115 and determines clock load information in this embodiment for the next desired attached die. If clock load information has been determined for all desired attached dice, an enhanced distribution load model 70 is created at step 125 representing for this embodiment an enhanced clock distribution load model. The enhanced distribution load model 70 can account for, or include projections of, the clock load information for all desired attached dice along with the clock load information for the primary die 16. The enhanced distribution load model 70 can also take into account where on the primary die 16 to allocate load information from attached dice, such as, for example, at a location on the primary die 16 corresponding to the location of one or more solder bumps 18 that provide clock signals from the primary die 16 to a second die 20.

Note that in some embodiments, the enhanced distribution load model 70 may be created after all of the load information for all desired attached dice has been determined. In other embodiments, the enhanced distribution load model 70 may be created as part of an iterative process. The iterative process for creating the enhanced distribution load model 70 may include creating the enhanced distribution load model 70 by adding each additional die's clock load information in turn to the clock load information for the primary die 16. Alternatively in other embodiments, the iterative process may include starting with the clock load information of a second die 20, adding the clock load information for each underlying die in a vertical stack, and ending with adding or projecting the cumulative clock load information for all attached dice onto the clock load information for the primary die 16.

Once the enhanced distribution load model 70 is completed, it is analyzed at step 130 to identify distribution issues, which in this embodiment are clock distribution issues. By creating the enhanced distribution load model 70, the clock distribution network of the entire stacked-die IC package 10 may be analyzed as if it were a single-die IC. For instance, the total net clock 78 for the IC package 10 may be calculated as if it were a single-die IC, while still taking into account the total clock load required by the primary die 16, the second die 20, and any additional desired attached dice. Similarly, as part of the analysis, any "hot spots" or unacceptable skew levels can be identified on the primary die 16 and/or any attached dice, such as the second die 20 illustrated in FIG. 1.

Although not shown in FIG. 4, the exemplary method 100 may be used iteratively to correct the distribution of a stacked-die IC 10. In other words, for example, the method 100 may be used to identify potential "hot spots" or, in this embodiment clock distribution issues. Once identified, the design may be corrected to eliminate these identified clock distribution issues. The method 100 may then be used again on the corrected design to identify further or new distribution issues for correction. These iterations may be repeated until there are no further changes or alterations made to the IC 10 and/or no clock distribution issues identified in the analysis of the enhanced load model 70.

Figure 5:
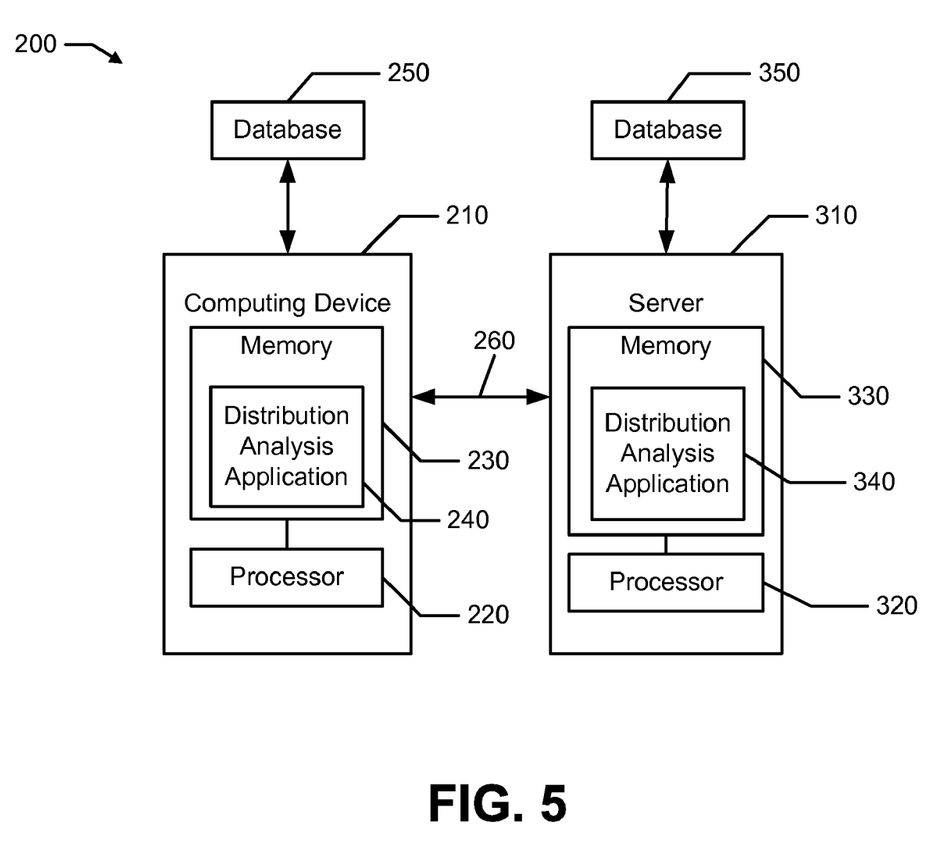
FIG. 5 is a block diagram of an exemplary system for implementing the method illustrated in FIG. 4.

Referring to FIG. 5, this figure is a block diagram of an exemplary system 200 that may be used to perform the method illustrated in FIG. 4, including for the exemplary embodiments described above. The exemplary system 200 may include a computing device 210, such as a desktop computer, laptop computer, tablet computer, smartphone, or the like, either as a stand-alone device or as part of a larger device. As illustrated in FIG. 5, the computing device 210 includes a processor 220 capable of executing instructions that is coupled to a memory 230 capable of storing instructions, data, code, applications or the like. The memory 230 may include instructions for one or more of the method steps described herein. The memory 230 may comprise a distribution analysis application 240 which may be a separate application for use with an IC design or modeling application or software (not shown), or may be part of an IC design or modeling application or software (not shown).

Alternatively, the distribution analysis application 240 may reside in a memory apart from the memory 230 or may be implemented in firmware, hardware, software, or any combination thereof, and may be embedded in other components of the computing device 210.

Further, the processor 220 and the memory 230 may serve as a means for executing one or more of the method steps described herein. A database 250 may also be connected to the computing device 210. The database 250 may include information associated with the performing of one or more of the method steps described herein or may include information associated with one or more of the IC package 10, primary die 16, second die 20, additional dice attached to the primary die 16, and/or components of any of these.

FIG. 5 shows that the exemplary system 200 may also include a server 310 in communication with the computing device 210 through communications link 260. The communications link 260 may be wired or wireless links and exemplary wireless links include, but are not limited to, radio-frequency ("RF") links, infrared links, acoustic links, and other wireless mediums. The communications link 260 may include a wide area network ("WAN"), a local area network ("LAN"), the Internet, a Public Switched Telephony Network ("PSTN"), a paging network, or a combination thereof.

The server 310 may include a processor 320 and a memory 330 coupled to the processor 320. The memory 330 may include instructions for executing one or more of the method steps described herein. Further, the processor 320 and the memory 330 may serve as a means for executing one or more of the method steps described herein. As illustrated, the memory 330 may include a distribution analysis application 340 which may be a separate application for use with an IC design or modeling application or software (not shown), or may be part of an IC design or modeling application or software (not shown).

The distribution analysis application 340 within the server 310 may be similar to the distribution analysis application 240 stored within the computing device 210, or the distribution analysis application 240 stored within the computing device 210 may be a thin client, sub-application, or other code or application that allows the computing device 210 to execute the distribution analysis application 340 stored on the server 310.

A database 350 may also be connected to the server 310. The database 350 may include information associated with the performing of one or more of the method steps described herein or may include information associated with one or more of the IC package 10, primary die 16, second die 20, additional dice attached to the primary die 16, and/or components of any of these.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example. Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another.

A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Therefore, although selected aspects have been illustrated and described in detail, it will be understood that various substitutions and alterations may be made therein without departing from the spirit and scope of the present invention, as defined by the following claims.

What is claimed is:

1. A method for distribution analysis of a stacked-die integrated circuit (IC), the method comprising:
   in one or more processors:
   analyzing clock distribution load information for a primary die of the IC to create a first clock distribution load model for the primary die of the IC;
   analyzing clock distribution load information for a second die of the IC that is coupled to the primary die to create a second clock distribution load model for the second die of the IC;
   projecting the clock distribution load model of the second clock distribution load model onto the first clock distribution load model to create an enhanced clock load model; and
   analyzing the enhanced clock distribution load model to identify clock distribution load issues of the IC.

2. The method of claim 1, wherein the clock distribution load information for the second die of the IC comprises clock distribution load information for at least one component of the second die to be clocked to at least one component of the primary die.

3. The method of claim 2, wherein the clock distribution load information for the second die of the IC further comprises clock distribution load information for a clock signal distribution path to the at least one component of second die.

4. The method of claim 3, wherein the clock signal distribution path further comprises a solder bump between the primary die and the second die.

5. The method of claim 1, further comprising:
   analyzing clock distribution load information for a third die of the IC that is coupled to the primary die to create a third clock distribution load model for the third die of the IC; and
   projecting the clock distribution load information of the third clock distribution load model onto the first and second clock distribution load models to create the enhanced clock load model.

6. The method of claim 1, further comprising:
analyzing clock distribution load information for a third die of the IC that is coupled to the second die to create a third clock distribution load model for the third die of the IC; and
projecting the clock distribution load information of the third clock distribution load model onto the first and second clock distribution load models to create the enhanced clock load model.

7. The method of claim 1, wherein the primary die comprises at least one of a processor, DRAM, Flash memory, ROM, EEPROM, RAM, field-programmable gate array, or analog component.

8. The method of claim 1, wherein the second die comprises at least one of a processor, DRAM, Flash memory, ROM, EEPROM, RAM, field-programmable gate array, or analog component.

9. A method for distribution analysis of a stacked-die integrated circuit (IC), the method comprising:
in one or more processors:
analyzing clock distribution load information for a primary die of the IC to create a first clock distribution load model for the primary die of the IC;
analyzing the first clock distribution load model to determine if the clock distribution load information in the first clock distribution load model exceeds a threshold value;
redesigning a portion of the primary die if the clock distribution load information exceeds the threshold value;
analyzing clock distribution load information for at least a second die of the IC that is coupled to the primary die to create a second clock distribution load model for the second die of the IC;
projecting the clock distribution load information of the second clock distribution load model onto the first clock distribution load model to create an enhanced clock load model; and
analyzing the enhanced clock distribution load model to determine if the clock distribution load information in the enhanced clock load' model exceeds the threshold value.

10. The method of claim 9, further comprising:
redesigning a portion of the primary die when the clock distribution load information in the enhanced clock load model exceeds the threshold value.

11. The method of claim 9, further comprising:
redesigning a portion of the second die when the clock distribution load information in the enhanced clock load model exceeds the threshold value.

12. The method of claim 9, further comprising:
analyzing clock distribution load information for at least a third die of the IC that is coupled to the primary die; and
projecting the clock distribution load information for the third die into the first clock distribution load model to create the enhanced clock load model.

13. The method of claim 12, wherein the step of analyzing the clock distribution load information for the third die of the IC further comprises: creating a third-die clock distribution load model for the third die using the clock load information for the third die.

14. The method of claim 9, further comprising:
analyzing clock distribution load information for at least a third die of the IC that is coupled to the second die; and
projecting the clock distribution load information for the third die into the first clock distribution load model to create the enhanced clock load model.

15. The method of claim 13, further comprising:
redesigning a portion of the third die when the clock distribution load information in the enhanced clock load model exceeds the threshold value.

* * * * *